US012622266B2

(12) United States Patent
Boone et al.

(10) Patent No.: US 12,622,266 B2
(45) Date of Patent: May 5, 2026

(54) DIE LEVEL CAVITY HEAT SINK

(71) Applicant: BAE Systems Information and Electronic Systems Integration Inc., Nashua, NH (US)

(72) Inventors: Alan P. Boone, Swisher, IA (US); Kaitlyn M. Fisher, Marion, IA (US); Jacob R. Mauermann, Marion, IA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 1189 days.

(21) Appl. No.: 17/533,809

(22) Filed: Nov. 23, 2021

(65) Prior Publication Data

US 2023/0163040 A1      May 25, 2023

(51) Int. Cl.
| | |
|---|---|
| *H10W 40/22* | (2026.01) |
| *H10W 90/00* | (2026.01) |
| *H10W 70/60* | (2026.01) |
| *H10W 90/20* | (2026.01) |

(52) U.S. Cl.
CPC ........... *H10W 40/22* (2026.01); *H10W 90/00* (2026.01); *H10W 70/60* (2026.01); *H10W 90/288* (2026.01); *H10W 90/722* (2026.01)

(58) Field of Classification Search
CPC ............... H01L 23/3675; H01L 25/105; H01L 2225/1023; H01L 2225/1058; H01L 2225/1094; H01L 23/49816; H01L 24/16; H01L 23/4334; H01L 23/3677; H01L 25/0652; H01L 25/0657; H01L 2225/06548; H01L 2225/06572; H01L 2225/06589; H01L 2225/107; H10W 40/22; H10W 90/00; H10W 70/60; H10W 90/288; H10W 90/722; H10W 72/20; H10W 72/823; H10W 90/22; H10W 90/701; H10W 40/778; H10W 40/228
See application file for complete search history.

(56) References Cited

U.S. PATENT DOCUMENTS

| | | | |
|---|---|---|---|
| 6,008,536 A | 12/1999 | Mertol | |
| 2009/0135567 A1 | 5/2009 | Fann et al. | |
| 2011/0227209 A1* | 9/2011 | Yoon ..................... | H01L 25/105 438/109 |
| 2013/0056862 A1 | 3/2013 | Kim et al. | |
| 2013/0285220 A1 | 10/2013 | Argento | |
| 2014/0061893 A1* | 3/2014 | Saeidi ................... | H01L 23/562 438/122 |

(Continued)

OTHER PUBLICATIONS

International Search Report, PCT/US22/49398, mailed Feb. 28, 2023, 10 pages.

*Primary Examiner* — Patricia D Valenzuela
(74) *Attorney, Agent, or Firm* — Sand, Sebolt & Wernow LPA

(57) ABSTRACT

A die level cavity heat sink that can be used within current and emerging packaging technologies to improve die level thermal performance within the package. Alternatively, or in addition, selective heat sink elements are provided to further manage thermal performance within a package by providing thermal pads from the interior of the package to a surface of a mold cap where additional thermal cooling mechanisms can be utilized to further remove heat from the package area.

16 Claims, 3 Drawing Sheets

(56)                    References Cited

U.S. PATENT DOCUMENTS

2016/0225742  A1*    8/2016  Davis ...................... H01L 25/50
2021/0074608  A1     3/2021  Hsu et al.
2021/0193552  A1     6/2021  Wan et al.

* cited by examiner

DIE LEVEL CAVITY HEAT SINK

TECHNICAL FIELD

The present disclosure relates to electronic systems packaging. More particularly, in one example, the present disclosure relates to thermal dissipation techniques and technologies for electronic systems packaging. Specifically, in another example, the present disclosure relates to integrated circuit packaging technologies with improved thermal dissipation performance.

BACKGROUND

Electronic systems technology is a rapidly evolving field with a push towards microelectronics that is driven by enhanced performance and miniaturization. In particular, there is a desire for electronic systems to be reduced in size to smaller and more compact packaging. Accordingly, the field of microelectronics is generally focused on creating the smallest form factor to fit into the smallest package while providing consistent or improved electronic performance.

It is common that these functional electronic systems are contained in a single package, such as a System in Package (SiP), or incorporated into a single integrated circuit known as a System in Chip package (SiC). As technology improves, the increased performance of electronic systems circuits and other components, coupled with the reduction in size and the nature of both packaging approaches, creates thermal loads that tend to exceed the capability of the traditional package thermal dissipation techniques and/or technologies. In particular, the higher performance requirements of the electronic components in modern electronic systems drive localized thermal loads at the individual integrated circuits, which may create excess buildup of localized heat that surpasses the temperature rating of the devices. This in turn can cause degradation of the performance of the integrated circuits and/or premature failure.

Further, the focus on reducing the size and weight limitations of current SiP and SiC packaging technologies coupled with the increased performance of the electronics systems contained therein further compound the limited ability to control thermal performance.

SUMMARY

The present disclosure addresses these and other issues by providing, in one aspect, a die level cavity heat sink that can be used within current and emerging packaging technologies to improve die level thermal performance within the package. Alternatively, or in addition, selective heat sink elements are provided to further manage thermal performance within a package by providing thermal pads from the interior of the package to a surface of a mold cap where additional thermal cooling mechanisms can be utilized to further remove heat from the package area.

In one aspect, an exemplary embodiment of the present disclosure may provide an electronic systems package comprising: at least one die in operable communication with a substrate; a heat sink defining a cavity containing the at least one die therein, the heat sink carried by the substrate; and wherein the heat sink is operable to direct heat generated from the at least one die into the substrate. This exemplary embodiment or another exemplary embodiment may further provide a first thermal interface material layer between the heat sink and the substrate; and a second thermal interface material layer between the heat sink and the at least one die.

This exemplary embodiment or another exemplary embodiment may further provide wherein the at least one die further comprises: a flip chip die. This exemplary embodiment or another exemplary embodiment may further provide a second substrate above the heat sink; wherein the heat sink is further operable to direct heat generated from the at least one die into the second substrate. This exemplary embodiment or another exemplary embodiment may further provide a second die above the second substrate and in operable communication therewith. This exemplary embodiment or another exemplary embodiment may further provide wherein the second die further comprises: one of a flip chip die and a wire bond die. This exemplary embodiment or another exemplary embodiment may further provide an encapsulant layer surrounding the second die. This exemplary embodiment or another exemplary embodiment may further provide wherein heat generated from the second die is dispersed into the encapsulant layer. This exemplary embodiment or another exemplary embodiment may further provide one or more selective heat sinks within the encapsulant layer surrounding the second die. This exemplary embodiment or another exemplary embodiment may further provide wherein heat generated from the second die is dispersed into the one or more selective heat sinks and out of the encapsulant layer. This exemplary embodiment or another exemplary embodiment may further provide wherein the heat sink further comprises: a thermal interface surface surrounding the die; and a thermal interface material layer between the thermal interface surface and the substrate. This exemplary embodiment or another exemplary embodiment may further provide wherein the heat sink is a first heat sink, the package further comprising: a second heat sink extending over the first heat sink and in thermal communication therewith; and a thermal interface material layer between the first heat sink and the second heat sink.

In another aspect, an exemplary embodiment of the present disclosure may provide a method of dispersing heat comprising: generating heat with at least one die contained in an electronic systems package; absorbing at least a portion of the heat generated by the at least one die with a heat sink defining a cavity containing the at least one die therein; directing the portion of the heat from the heat sink through a thermal interface surface to a substrate carrying the heat sink thereon; and dispersing the portion of the heat away from the die. This exemplary embodiment or another exemplary embodiment may further provide directing at least part of the portion of the heat to the substrate carrying the heat sink; and directing at least another part of the portion of the heat to a second substrate above the heat sink and in thermal connection therewith. This exemplary embodiment or another exemplary embodiment may further provide generating heat with at least one additional die in the electronics systems package, the at least one additional die carried by a second substrate above the heat sink and in thermal connection therewith; and directing at least a portion of the heat generated by the at least one additional die into the encapsulant layer surrounding the at least one additional die.

In yet another aspect, an exemplary embodiment of the present disclosure may provide a method of dispersing heat comprising: enclosing a first die carried on a first substrate of an electronics system package in a first heat sink defining a cavity, the cavity containing the first die therein; generating heat with the first die; generating heat with a second die carried by a second substrate above the first heat sink and in thermal communication therewith; absorbing at least a portion of the heat generated by the first die with the first heat sink; absorbing at least a portion of the heat generated by the second die with a second heat sink within an encapsulant layer surrounding the second die; and directing the portion of heat from the first die and the portion of the heat from the second die away from the first and second dies. This exemplary embodiment or another exemplary embodiment may further provide wherein directing the portion of heat away from the first and second dies further comprises: directing a first part of the portion of the heat from the first die to the first substrate; directing a second part of the portion of the heat from the first die to the second substrate and into the second heat sink; and dissipating the second part of the portion of heat from the first die and the portion of the heat from the second die from the second heat sink and away from the first and second dies. This exemplary embodiment or another exemplary embodiment may further provide generating heat with a third die carried by the second substrate; absorbing at least a portion of the heat generated by the third die with the second heat sink within the encapsulant layer surrounding the third die; and directing the portion of heat from the third die away from the first, second, and third dies. This exemplary embodiment or another exemplary embodiment may further provide wherein directing the portion of heat from the third die away from the first, second, and third dies further comprises: dissipating the portion of heat from the third die away from the first, second, and third dies through the second heat sink. This exemplary embodiment or another exemplary embodiment may further provide wherein the second heat sink further comprises: at least one of a heat conductive material slug on top of the second die, a heat conductive material slug on top of the third die, and at least one heat conductive material slug within the encapsulant layer between the second and third dies.

In yet another aspect, an exemplary embodiment of the present disclosure may provide an electronic systems package comprising: a first die in operable communication with a first substrate; a second die in operable communication with a second substrate above the first substrate and in thermal communication therewith; an encapsulant layer surrounding the second die; and at least one heat sink within the encapsulant layer surrounding the second die; wherein the at least one heat sink is operable to direct heat generated from the first and second dies out from the package and away from the first and second dies. This exemplary embodiment or another exemplary embodiment may further provide a thermal interface material layer between each of the at least one heat sinks and the second substrate. This exemplary embodiment or another exemplary embodiment may further provide wherein the at least one heat sink further comprises: at least one of a heat conductive material slug on top of the second die and at least one heat conductive material slug adjacent the second die within the encapsulant layer. This exemplary embodiment or another exemplary embodiment may further provide a third die in operable communication with the second substrate. This exemplary embodiment or another exemplary embodiment may further provide wherein the at least one heat sink further comprises: at least one of a heat conductive material slug on top of the second die, a heat conductive material slug on top of the third die, and at least one heat conductive material slug within the encapsulant layer between the second and third dies. This exemplary embodiment or another exemplary embodiment may further provide wherein the first die further comprises: a flip chip die. This exemplary embodiment or another exemplary embodiment may further provide wherein the second die further comprises: one of a flip chip die and a wire bond die. This exemplary embodiment or another exemplary embodiment may further provide wherein the third die further comprises: one of a flip chip die and a wire bond die. This exemplary embodiment or another exemplary embodiment may further provide a second heat sink between the first die and the second substrate. This exemplary embodiment or another exemplary embodiment may further provide wherein the second heat sink further comprises: a cavity defined in the second heat sink, the cavity containing the first die therein. This exemplary embodiment or another exemplary embodiment may further provide wherein the second heat sink further comprises: a thermal interface surface surrounding the first die; and a thermal interface material layer between the thermal interface surface and the substrate. This exemplary embodiment or another exemplary embodiment may further provide wherein heat generated from the first die second die is dispersed through the second heat sink into the first substrate via the thermal interface surface.

In yet another aspect, an exemplary embodiment of the present disclosure may provide a method of dispersing heat comprising: generating heat with a first die carried by a first substrate contained in an electronic systems package; generating heat with a second die carried by a second substrate above the first die; absorbing at least a portion of the heat generated by the first and second dies with at least one heat sink within an encapsulant layer surrounding the second die; and directing the portion of heat from the first and second dies away from the first and second dies through the at least one heat sink. This exemplary embodiment or another exemplary embodiment may further provide wherein directing the portion of heat from the first and second dies further comprises: directing a first part of the portion of the heat from the first die to the first substrate; directing a second part of the portion of the heat from the first die through the second substrate and into the second heat sink; dissipating the first part of the portion of the heat from the first die through the first substrate and away from the first and second dies; and dissipating the second part of the portion of heat from the first die and the portion of the heat from the second die through the second heat sink and away from the first and second dies. This exemplary embodiment or another exemplary embodiment may further provide generating heat with a third die carried by the second substrate; and directing at least a portion of the heat generated by the third die into the at least one heat sink. This exemplary embodiment or another exemplary embodiment may further provide dissipating the portion of the heat from the third die away from the first, second, and third dies through the at least one heat sink.

In yet another aspect, an exemplary embodiment of the present disclosure may provide an electronic systems package comprising: a first die in operable communication with a first substrate; a first heat sink defining a cavity containing the first die therein, the first heat sink carried by the first substrate; a second die in operable communication with a second substrate above the first substrate and in thermal communication therewith; an encapsulant layer surrounding the second die; and a second heat sink within the encapsulant layer surrounding the second die; wherein the first heat sink is operable to direct heat generated from the first die into the first and second substrates and wherein the second heat sink is operable to direct heat generated from the second substrate and the second die out from the package and away from the first and second dies. This exemplary embodiment or another exemplary embodiment may further provide wherein the first heat sink further comprises: a thermal interface surface surrounding the first die; and a thermal interface material layer between the thermal interface surface and the first substrate. This exemplary embodiment or another exemplary embodiment may further provide a third die in operable communication with the second substrate. This exemplary embodiment or another exemplary embodiment may further provide wherein the second heat sink further comprises: at least one of a heat conductive material slug on top of the second die, a heat conductive material slug on top of the third die, and at least one heat conductive material slug within the encapsulant layer between the second and third dies.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figures 1, 2:
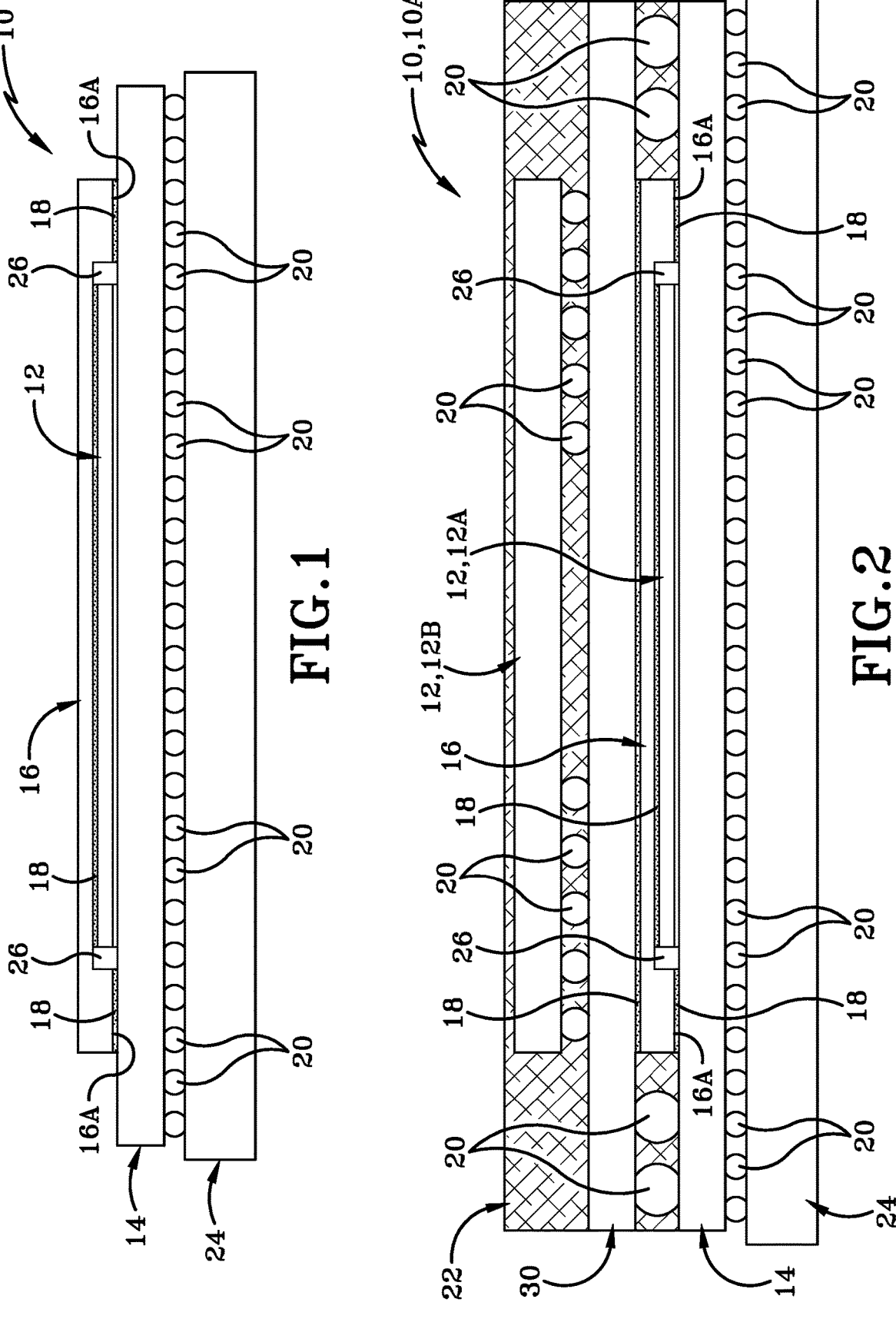
FIG. 1 is a side elevation schematic view of an exemplary electronic systems package with a die level cavity heat seat included therein according to one aspect of the present disclosure.
FIG. 2 is a side elevation schematic view of an exemplary stacked flip chip package on package (POP) configuration electronic systems package with a die level cavity heat seat included therein according to one aspect of the present disclosure.

An electronic systems (ES) package is shown and generally indicated in the figures provided herewith at reference 10. ES package 10 will first be described generally herein before provided with additional details below. ES package 10 may be any suitable package or packaging technology including functional electronic systems contained in a single package, known as a System in Package (SiP) or as a single integrated circuit (IC) known as a System in Chip package (SiC). As these ES packages are being increasingly reduced in size and becoming more compact, traditional package level thermal dissipation techniques and technologies may be employed to further enhance the capacity of ES package 10 to move heat away from individual ICs to prevent failure of the IC.

Accordingly, with reference to FIG. 1, an exemplary ES package 10 is shown and generally described having one or more chip dies 12, hereinafter referred to as die or dies 12, a flip chip substrate 14, a cavity heat sink 16, one or more thermal interface material layers 18 and a plurality of solder balls 20. As best seen in FIG. 2, ES package 10 may further include a mold or encapsulant material 22 and a host board 24. As discussed further herein, ES package 10 may be suitable for use in stacked packaging configurations as well as individual packaging configurations.

Although described herein with components "on top of" or "above" other elements or components, it will be understood that the ES package solutions may be provided with any suitable orientation. Accordingly, as used herein, directional or location terms will be understood to be relative to other components and relative to the orientation illustrated in the figures. For example, with reference to FIG. 1, host board 24 may be the bottom of ES package 10 while substrate 14 and cavity heat 16 may be stacked "on top" of or "above" the host board 24. In real world applications, host board 24 may be the "top" with the other layers provided beneath.

Die 12 may be an integrated circuit of any suitable material such as electronics grade silicon, gallium arsenide, or any other suitable semi-conductor material. Die 12 may include one or more functional circuits fabricated thereon through any suitable fabrication means, such as photo-lithograpy or the like. Circuitry printed on dies 12 may be for any suitable or desired purpose, as dictated by the desired implementation. Further, as discussed herein, ES package 10 may be scaled, including dies 12, to any suitable size, as desired. Die 12 may be considered a six-sided die, with a single active side. The active side of the die 12 may be the side of the die 12 having the printed circuitry thereon, while the opposite side thereto may be referred to as the back.

Flip chip substrate 14 (and/or substrate 30, discussed below) may be any suitable substrate including printed circuit boards (PCB) having ball grid array (BGA) capacities and may include any suitable connections or traces, including solder balls or the like, thereon to accommodate one or more dies 12 as used for an integrated circuit or electronic system.

Cavity heat sink 16, as described in further detail below, may be a die 12 level cavity heat sink 16 which may be formed of any suitable heat conducting material, as described further herein. According to one aspect, cavity heat sink 16 may be formed from copper. Cavity heat sink 16 may include one or more surfaces for interaction with thermal interface material layers 18, as discussed further below. Cavity heat sink 16 may be produced in any suitable size and may include a central cavity 26 which may encase one or more dies 12 therein. Cavity heat sink 16 may be a five-sided heat sink in that it may enclose five sides of a six-sided die 12, which the remaining unenclosed side being the active face of the die 12. Cavity heat sink 16 may extend over the back of die 12 such that the back and sides are in thermal contact with, or in close proximity to, the heat sink while the active side of die 12 is free to interact with the substrate 14, as discussed herein.

Thermal interface material layers 18 may be any suitable material inserted between one or more components of ES package 10 to enhance the thermal coupling between adjacent components. These thermal interface material layers 18 may be any suitable material including, but not limited to, thermal paste, thermal adhesive, thermal gap filler, thermally conductive pads, thermal tape, phase change materials, or metal thermal interface materials, as dictated by the desired implementation. These thermal interface materials layers 18 may be provided at the intersection of any or all components of ES package 10, as dictated by the desired implementation and as discussed further below. According to one aspect, thermal interface material 18 may be provided at all intersections between heat producing elements (i.e. dies 12) and heat sink elements (e.g. cavity heat sink 16 and/or selective heat sinks 28) as well as between all heat sink elements and surrounding structures (e.g. substrates 14, 30). Thermal interface material 18 may act as an adhesive between such layers in addition to its role in thermal dissipation.

Solder balls 20 may be formed of any suitable solder material, such as copper, nickel, and/or gold materials, or combinations thereof, which may be soldered to the flip chip substrate 14 and under-filled with epoxy to allow for electrical communication between any integrated circuits, dies 12, PCBs, or other components of ES package 10, as dictated by the desired implementation. Solder balls 20, as discussed further below, may be placed strategically on flip chip substrate 14 and/or between stacked layers of ES package 10.

Mold material 22 may encapsulate one or more components of ES package 10, as desired, and may formed of any suitable materials including epoxy, epoxy resins, or the like. Mold/encapsulant 22 may surround or enclose most of ES package 10 once the other components thereof are assembled.

The host board 24 may be an additional substrate, which may be in electrical connection with the flip chip substrate 14 and the components carries thereon and allow electrical communication therebetween. Host board 24 may serve any suitable purpose or be any suitable type of host board, as dictated by the desired implementation. According to one aspect, as illustrated herein, host board 24 may be connected to flip chip substrate 14 via a plurality of solder balls 20.

With continued reference to FIG. 1, cavity heat sink 12 may be utilized within current and emerging packaging technologies to improve die 12 thermal performance within ES package 10. Cavity heat sink 16 may fully encompass one or more dies 12 within cavity. As shown in FIG. 1, die 12 may be a flip chip die having an epoxy underfill, which may be a die wherein the active side is flipped to face the flip chip substrate 14. In such a configuration, cavity heat sink 16 may extend across the inactive side of die 12 and may be thermally joined thereto by a thermal interface material layer 18. Cavity 26 may further allow cavity heat sink 16 to enclose die 12 therein while simultaneously providing a thermal interface surface (shown at reference 16A) where heat sink 16 and flip chip substrate 14 may meet with a layer of thermal interface material 18 therebetween. Although shown with thermal interface material layer 18 on either side of the die 12 and at the junction of cavity heat sink 16 and flip chip substrate 14, it will be understood that cavity heat sink may surround the outer edges of die 12 such that the thermal interface surface 16A and thermal interface material layer 18 may be a continuous layer surrounding die 12 and interacting with the flip chip substrate 14 through the thermal interface material layer 18.

This thermal interface surface 16A and thermal interface material layer 18 may facilitate cavity heat sink 16 drawing excess heat away from die 12 and directing it into into flip chip substrate 14 to reduce die junction temperatures as compared to existing thermal dissipation techniques. Additionally, cavity heat sink 16 may have a thermal interface surface 16A with a thermal interface material layer 18 connecting heat sink 16 to a stacked substrate 30, as discussed further below.

The cavity heat sink 16 may be scaled to any sized die 12 and/or adapted for most, if not all, current packaging constraints; however, it will be understood that the maximum thermal benefit of cavity heat sink 16 may be best realized when used with flip chip packaging solutions as this allows the greatest surface area of the die 12 to be in thermal connection with the cavity heat sink 16 thus drawing the most heat away from the die 12.

With reference to FIG. 2, according to one aspect, an exemplary ES package 10 is shown in a stacked flip chip package on package configuration (shown as ES package 10A). This configuration may be similar to the flip chip packing solution provided in FIG. 1 but for the inclusion of an additional stacked substrate 30 and die(s) 12 above the cavity heat sink 16. Stacked substrate 30 may be substantially similar to flip chip substrate 14 but for its location on top of flip chip substrate 14 and may be a PCB or any other suitable substrate material. Stacked substrate 30 may include an additional mold/encapsulant 22 layer. Stacked substrate 30 may further include or carry one or more additional dies 12 thereon, as discussed below.

Stacked substrate 30 may be secured to the flip chip substrate 14 through additional solder balls 20 as stacking solder balls, which may be substantially similar to solder balls 20 between flip chip substrate 14 and host board 24 but for their placement between flip chip substrate 14 and stacked substrate 30.

Additionally, stacked substrate 30 may be adjacent with cavity heat sink 16 and may be thermally connected thereto by an additional thermal interface material 18 layer, as desired, or as dictated by the desired implementation. In this configuration, a first die, indicated at 12A may be a flip chip die 12 as previously discussed herein. First die 12A may therefore be the die 12A that is contained within cavity 26 of cavity heat sink 16. A second die 12B may be a die 12 operably connected to stacked substrate 30. Second die 12B may be a flip chip die 12 (as illustrated in FIG. 2) or may be a wire bond die 12, as desired. In this stacked assembly, as discussed further below, heat may dissipate from first die 12A through cavity heat sink 16 and into the flip chip substrate 14 and the stacked substrate 30. Heat may further dissipate through the mold/encapsulant 22 extending over the second die 12B as well as through the solder balls 20 and into host board 24.

Modeling data for a stacked flip chip package on package configuration utilizing cavity heat sink 16 has shown up to a five percent improvement in thermal performance based on the maximum conjunction temperature as compared to current approaches wherein only mold material 22 encapsulates the first die 12A between the flip chip substrate 14 and stacked substrate 30. Additionally, the cavity heat sink 16 arrangement wherein the entirety of die 12A is contained within cavity 26 of cavity heat sink 16 may provide an additional two to three percent improvement in thermal performance as compared to a flat heat sink extending over the die 12A but without the thermal interface and thermal interface material layer 18 between cavity heat sink 16 and flip chip substrate 14.

Figures 3, 4:
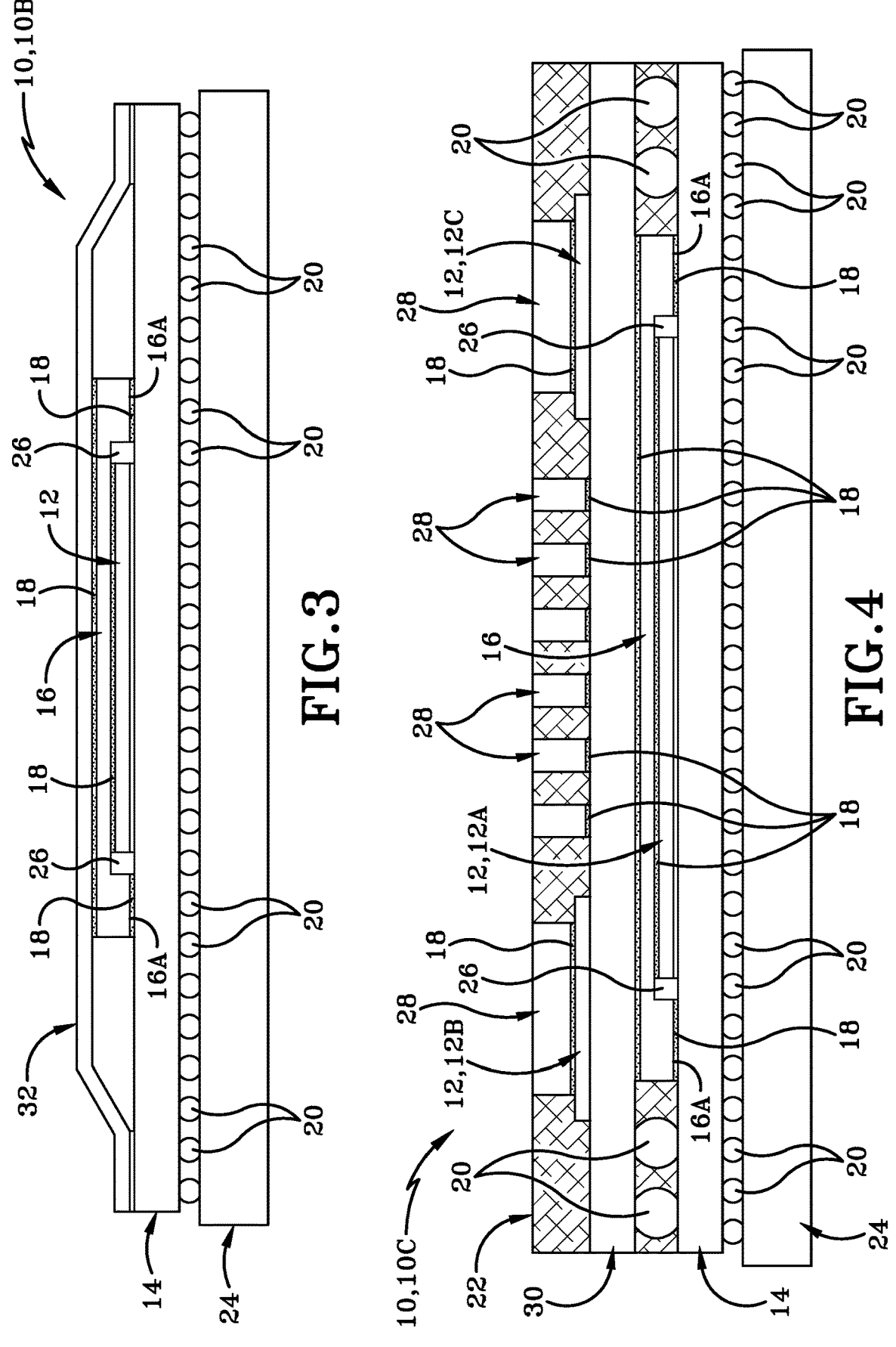
FIG. 3 is a side elevation schematic view of an exemplary thermal flip chip configuration electronic systems package with a die level cavity heat seat included therein according to one aspect of the present disclosure.
FIG. 4 is a side elevation schematic view of an exemplary stacked flip chip PoP configuration electronic systems package with a die level cavity heat seat and selective heat sink elements included therein according to one aspect of the present disclosure.

With reference to FIG. 3, a second exemplary ES package 10B is shown in a thermal flip chip package ball grid array (BGA) configuration. The thermal flip chip BGA package may include an additional heat sink 32, which may be an current, or industry standard heat sink, and which may extend over the die; however, the inclusion of cavity heat sink 16 between die 12 and standard heat sink 32 may provide a ten percent or better improvement in thermal performance as compared to current thermal flip chip packages utilizing only standard heat sink 32. In this configuration, die 12 may be thinned and extended horizontally to provide additional surface area and/or thermal contact between die 12 and cavity heat sink 16 which may further improve the thermal performance of ES package 10.

This particular configuration, namely, the thermal flip chip package, including standard heat sink 32 is considered a leading industry standard package for flip chip die applications and is often recognized as one of the best packaging styles for high thermal dissipation currently within the electronic systems industry. The inclusion of cavity heat sink 16 in conjunction with the thinned die 12 contained in cavity 26 therein may provide a ten percent or greater improvement in thermal performance with minimal manufacturing changes allowing this approach to maintain its status as an industry-wide solution while improving thermal dissipation performance thereof. As previously discussed herein, die 12 and cavity heat sink 16 may be scaled to any suitable size, further allowing flexibility in the utilization thereof.

With reference to FIG. 4, a stacked flip chip package on package configuration of ES package 10C, similar to the ES package 10A of FIG. 2, is shown having a first die 12, 12A utilizing a cavity heat sink 16 along with second and third dies 12B and 12C stacked thereon. As shown, ES package 10C includes the same elements or components as previously discussed herein, namely, dies 12, a base flip chip substrate 14, a cavity heat sink 16, several thermal interface material layers 18, a plurality of solder balls 20, mold/encapsulant 22, a host board 24, and a stacked substrate 30. Additionally, ES package 10C may include one or more selective heat sink 28 components, which will now be discussed in further detail.

In particular, as compared to ES package 10A in FIG. 2, the ES package 10C of FIG. 4 may be substantially similar in the inclusion of a flip chip die 12, 12A on a base flip chip substrate 14 having a cavity heat sink 16 containing die 12A within the cavity 26 thereof. Above cavity heat sink 16 may similarly be a stacked substrate 30 having one or more additional dies 12, shown here as dies 12B and 12C, which may be flip chip dies 12 or may alternatively be wire bond dies 12, as discussed further below. ES package 10C may be electrically connected to a host board 24 thorough one or more solder balls 20, as dictated by the desired implementation thereof.

ES package 10C may differ from ES package 10A in that ES package 10C may further include one or more selective heat sink 28 elements which may be or include one or more heat conductive material slugs disposed on top of dies 12B and/or 12C, when dies 12B and 12C are flip chip dies. Where dies 12B and 12C are wire bond dies, one or more selective heat sinks 28 may be selectively placed within the mold/encapsulant 22 in the free space between dies 12B and 12C. Similarly, selective heat sink 28 may be placed in both areas, namely between dies 12 and on top of dies 12, where space permits and/or installation parameters allow therefor.

Selective heat sink 28 may serve as a conductive heat path which may absorb or otherwise draw heat away from key areas within ES package 10C and out through the top of the ES package 10C, as described further below. According to one aspect, selective heat sink 28 may draw sufficient heat away from dies 12 and into mold/encapsulant 22 for dissipation therein. According to another aspect, selective heat sink 28 components may be even with the mold/encapsulant 22 (or may extend slightly out of the mold/encapsulant 22) as to be exposed to the exterior of ES package 10C, which may further allow other thermal cooling mechanisms, such as fans or the like, contained within the electronic systems to further dissipate heat away from dies 12 and other key areas within ES package 10C.

Selective heat sink 28 may be formed of any suitable heat conductive material including, but not limited to, copper, gold, or the like. Selective heat sink 28, similar to cavity heat sink 16, may be scaled to any die size or available package area and may be placed or configured in any suitable position as dictated by the configuration of each individual package. Accordingly, selective heat sink 28 may be readily incorporated into existing packaging technologies through placement in empty space or open areas between components to further enhance the thermal dissipation of the package as a whole.

Selective heat sink 28 may further be utilized in packages without cavity heat sink 16 or may alternatively be included in packages utilizing cavity heat sink 16 therein. Similarly, ES package 10 may include cavity heat sink 16 but may omit or otherwise not require use of selective heat sink 28, depending on the particular implementation and configuration thereof. The inclusion of selective heat sink 28 alone may provide as much as a two and a half percent improvement in thermal performance as compared to packages strictly utilizing mold compound over the dies 12 and substrates 14, 30. Collectively, an ES package 10 utilizing both cavity heat sink 16 and selective heat sinks 28 may further enhance the flow of heat away from key areas of ES package 10.

Figure 5:
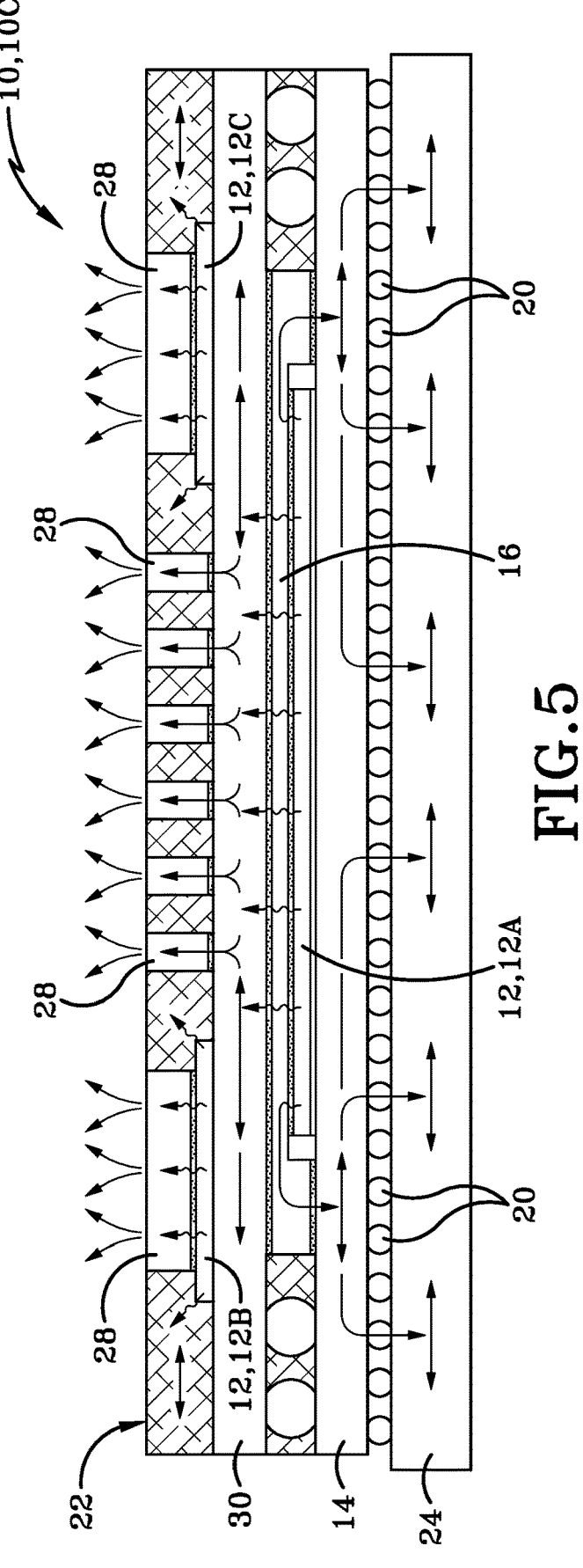
FIG. 5 is a side elevation schematic view of the exemplary electronic systems package from FIG. 4 showing exemplary heat dissipation paths according to one aspect of the present disclosure.

With reference to FIG. 5, the ES package 10C of FIG. 4 is shown with additional arrows indicating various paths that heat may take after being generated by dies 12. As shown therein, wavy lines/arrows represent the heat as it is generated while standard arrows represent the paths that heat may take as it is moved away from key areas such as dies 12. These arrows are generally placed to represent the path in which heat may travel through the various components of ES package 10C and are intended as a representative example thereof. Accordingly, it will be understood that heat may travel or otherwise dissipate in any or all directions; however, the inclusion of cavity heat sink 16 and/or selective heat sink 28 may further enhance this thermal dissipation by providing a path of least resistance for heat to move or otherwise dissipate away from key components.

The improvements in thermal performance provided by cavity heat sink 16, selective heat sink 28, or a combination thereof, are intended and further understood to remove heat from packages 10, dissipate heat within packages 10 away from key components, and/or to keep the dies 12 below a critical operating temperature for as long as possible. Where ES packages 10 are adapted for steady state type electronics, the inclusion of cavity heat sink 16 and/or selective heat sink 28 may allow heat to be drawn into areas where it may be further dissipated through other heat removal components, such as fans or other cooling components. For example, in a computer or personal electronic device, the addition of a cavity heat sink 16 and/or selective heat sinks 28 may direct heat towards cooling fans or vents contained therein. In short life electronic systems, such as those found in many military applications, the inclusion of cavity heat sink 16 and/or selective heat sink 28 may serve to dissipate heat within package 10, or out of package 10, to provide the longest temporary lifespan of die 12 while maintaining high performance throughout the entire lifespan thereof.

According to one example, an ES package 10, including cavity heat sink 16 and/or selective heat sink 28, may be utilized as a processor or memory in a GPS guidance system which may utilized in munitions. The lifespan of such applications may require peak performance of dies 12 but only for a short period of time, often only a matter of minutes or less. The inclusion of cavity heat sink 16 and/or selective heat sink 28 may therefore be critical as the inclusion thereof may permit maximum performance levels throughout the entire lifespan of ES package 10.

According to one aspect, it will be understood that where additional layers may be utilized, including additional substrate layers and dies, additional cavity heat sinks and/or selective heat sinks may be included beyond those illustrated and discussed herein, while remaining within the scope with the present disclosure.

Having thus described the elements and components of the exemplary ES packages 10, a method of use therefor will now be discussed.

As described herein, the method of use is discussed with reference to FIG. 5; however, it will be understood that the method(s) described are representative examples and may apply to all embodiments of ES packages 10 having a cavity heat sink 16 and/or selective heat sinks 28 therein. It will be understood, in particular due to the scalability of the cavity heat sink 16 and selective heat sinks 28, that the method(s) described herein may similarly include other packaging solutions not explicitly discussed herein.

Accordingly, with reference to FIG. 5, in one example, an ES package 10 may be assembled in any suitable configuration (such as in a stacked flip chip package on package configuration as shown) according to standard manufacturing techniques. ES package 10 may be further installed in other electronic systems as a component thereof and operated therewith. For example, where ES package 10 is part of a navigation or GPS system, it may be installed as a component of the larger system. Similarly, any number of ES packages 10 may be utilized in larger systems, as desired or dictated by the desired implementation.

Once installed and in normal operation, it is understood that dies 12 will begin to generate heat, with the temperature levels thereof increasing rapidly. As the heat is generated, shown as wavy arrows in FIG. 5, it will radiate outward from dies 12 in generally all directions. The active side of dies 12, being engaged with substrates 14, 30 may reflect or otherwise cause heat to be more easily dispersed through the back and sides of dies 12. Heat leaving first die 12A may be readily absorbed by heat sink 16. Similarly, heat generated by second and third dies 12B and 12C may be readily absorbed by selective heat sinks 28. As mentioned above, these heat sinks 16 and 28 represent the path of least resistance for the heat generated from dies 12 and therefore function to draw the heat away therefrom and direct the heat to other locations.

In particular, as first die 12A is fully enclosed within ES package 10, the cavity heat sink 16 may draw heat away from die 12A and disperse that heat into substrate 14 through thermal interface surface 16A and thermal interface material layer 18. Similarly, where ES package 10 is a stacked package (as with package 10C), cavity heat sink may further dissipate heat into stacked substrate 30.

As with cavity heat sink 16, selective heat sinks 28 may absorb heat generated by second and third dies 12B and 12C and, again as the path of least resistance, may draw heat away therefrom. This heat may then be dispersed out of ES package 10 or, at least in part, into the mold/encapulant 22 surrounding heat sinks 28. Further, any heat transferring through cavity heat sink 16 into stacked substrate 30 may likewise follow the least restrictive path through selective heat sinks 28, as shown.

Ultimately, the goal of all ES packing technologies is to draw heat away from the key areas, namely the dies 12, and disperse that heat to other remote structures and/or into the environment external of the package. As shown and described herein, the inclusion of cavity heat sink 16 and/or selective heat sinks 28 may provide a more efficient and longer lasting solution while remaining scalable in size and with minimal effect on costs and manufacturing considerations as compared to current packaging technologies.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. An electronic systems package comprising:
at least one die in operable communication with a substrate;
a heat sink defining a cavity containing the at least one die therein, the heat sink carried by the substrate; and
wherein the heat sink is operable to direct heat generated from the at least one die into the substrate.

2. The package of claim 1 further comprising:
a first thermal interface material layer between the heat sink and the substrate; and
a second thermal interface material layer between the heat sink and the at least one die.

3. The package of claim 1 wherein the at least one die further comprises:
a flip chip die.

4. The package of claim 3 further comprising:
a second substrate above the heat sink;
wherein the heat sink is further operable to direct heat generated from the at least one die into the second substrate.

5. The package of claim 4 further comprising:
a second die above the second substrate and in operable communication therewith.

6. The package of claim 5 wherein the second die further comprises:
one of a flip chip die and a wire bond die.

7. The package of claim 5 further comprising:
an encapsulant layer surrounding the second die.

8. The package of claim 7 wherein heat generated from the second die is dispersed into the encapsulant layer.

9. The package of claim 7 further comprising:
one or more selective heat sinks within the encapsulant layer surrounding the second die.

10. The package of claim 9 wherein heat generated from the second die is dispersed into the one or more selective heat sinks and out of the encapsulant layer.

11. The package of claim 1 wherein the heat sink further comprises:
a thermal interface surface surrounding the die; and a thermal interface material layer between the thermal interface surface and the substrate.

12. The package of claim 1 wherein the heat sink is a first heat sink, the package further comprising:
a second heat sink extending over the first heat sink and in thermal communication therewith; and
a thermal interface material layer between the first heat sink and the second heat sink.

13. A method of dispersing heat comprising:
generating heat with at least one die contained in an electronic systems package;
absorbing at least a portion of the heat generated by the at least one die with a heat sink defining a cavity containing the at least one die therein;
directing the portion of the heat from the heat sink through a thermal interface surface to a substrate carrying the heat sink thereon; and
dispersing the portion of the heat away from the die.

14. The method of claim 13 further comprising:
directing at least part of the portion of the heat to the substrate carrying the heat sink; and
directing at least another part of the portion of the heat to a second substrate above the heat sink and in thermal connection therewith.

15. A method of dispersing heat comprising:
enclosing a first die carried on a first substrate of an electronics system package in a first heat sink defining a cavity, the cavity containing the first die therein;
generating heat with the first die;
generating heat with a second die carried by a second substrate above the first heat sink and in thermal communication therewith;
absorbing at least a portion of the heat generated by the first die with the first heat sink;
absorbing at least a portion of the heat generated by the second die with a second heat sink within an encapsulant layer surrounding the second die; and
directing the portion of heat from the first die and the portion of the heat from the second die away from the first and second dies.

16. The method of claim 15 wherein directing the portion of heat away from the first and second dies further comprises:
directing a first part of the portion of the heat from the first die to the first substrate;
directing a second part of the portion of the heat from the first die to the second substrate and into the second heat sink; and
dissipating the second part of the portion of heat from the first die and the portion of the heat from the second die from the second heat sink and away from the first and second dies.

* * * * *